United States Patent [19]
Lee et al.

[11] Patent Number: 5,846,863
[45] Date of Patent: Dec. 8, 1998

[54] METHOD FOR MANUFACTURING A SEMICONDUCTOR ROM DEVICE

[75] Inventors: Woon-kyung Lee, Seoul; Sung-bu Jun, Kyungki-do, both of Rep. of Korea

[73] Assignee: Samsung Electronics Co., Ltd., Kyungki-do, Rep. of Korea

[21] Appl. No.: 779,469

[22] Filed: Jan. 8, 1997

Related U.S. Application Data

[62] Division of Ser. No. 604,785, Feb. 23, 1996, Pat. No. 5,721,698.

[30] Foreign Application Priority Data

Mar. 31, 1995 [KR] Rep. of Korea ......................... 95-7589

[51] Int. Cl.$^6$ .................... H01L 21/8246; H01L 21/8234
[52] U.S. Cl. ........................... 438/275; 438/277; 438/282
[58] Field of Search ............................ 438/128, 275–279, 438/282; 257/390–392

[56] References Cited

U.S. PATENT DOCUMENTS 4,180,826 12/1979 Shappir ................................... 438/275
5,394,356 2/1995 Yang ....................................... 438/276

*Primary Examiner*—Joni Chang
*Attorney, Agent, or Firm*—Cushman Darby&Cushman IP Group of Pillsbury Madison & Sutro LLP

[57] ABSTRACT

A semiconductor memory device and a method for manufacturing the same are disclosed. The device includes a plurality of active regions repeatedly formed extending in parallel to each other, a device isolation region, a plurality of first gate electrodes repeatedly arranged being perpendicular to the active region and device isolation region, a source/drain region formed by being self-aligned ion-implanted into the first gate electrode, active region, and device isolation region, and a second gate electrode located between the first gate electrodes, extending in parallel to the first gate electrode, sharing the source/drain with the first gate electrode, and using the device isolation region as a channel. Thus, cell integration can be enhanced, and high speed operation and excellent yields can be easily ensured.

11 Claims, 16 Drawing Sheets

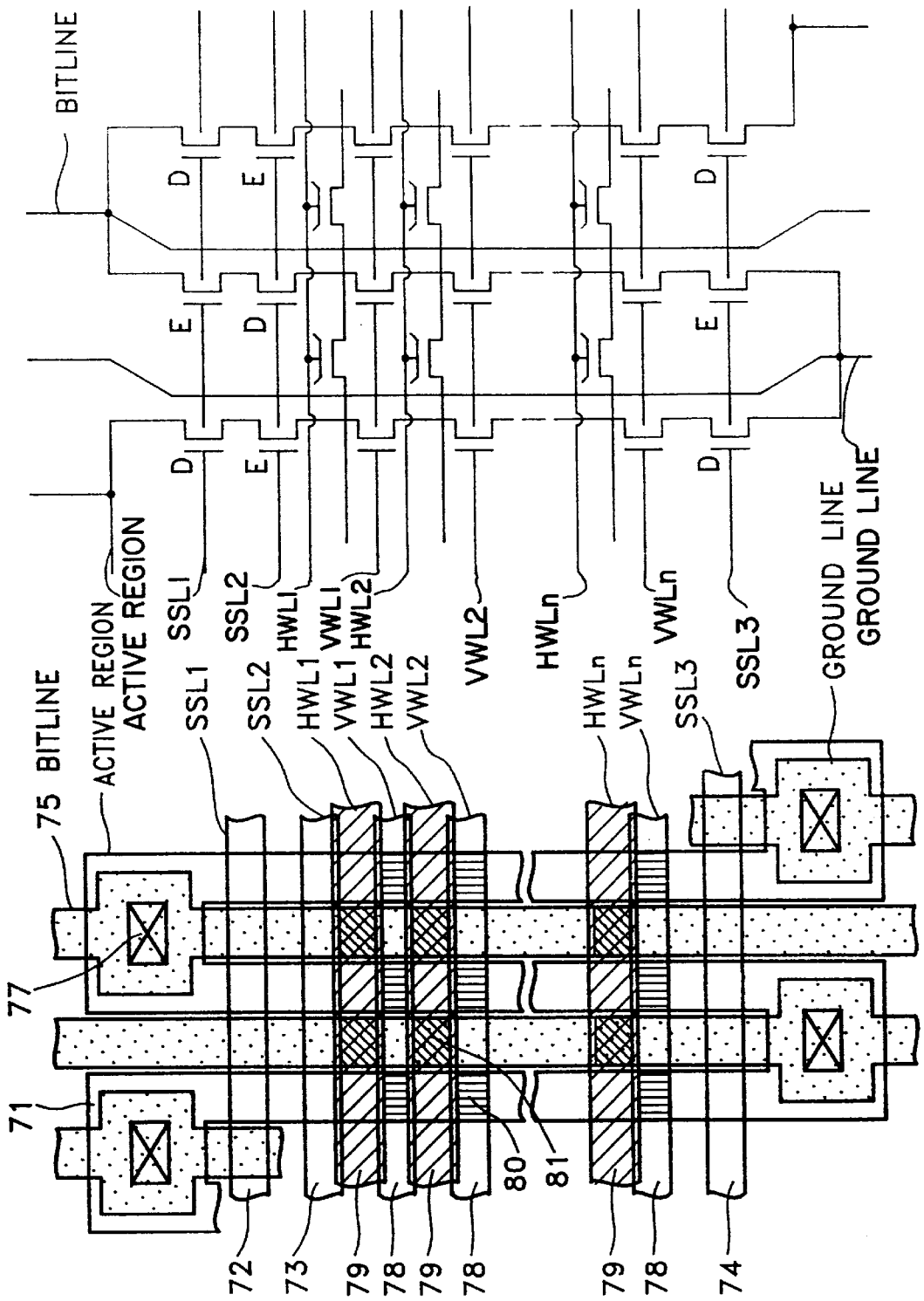

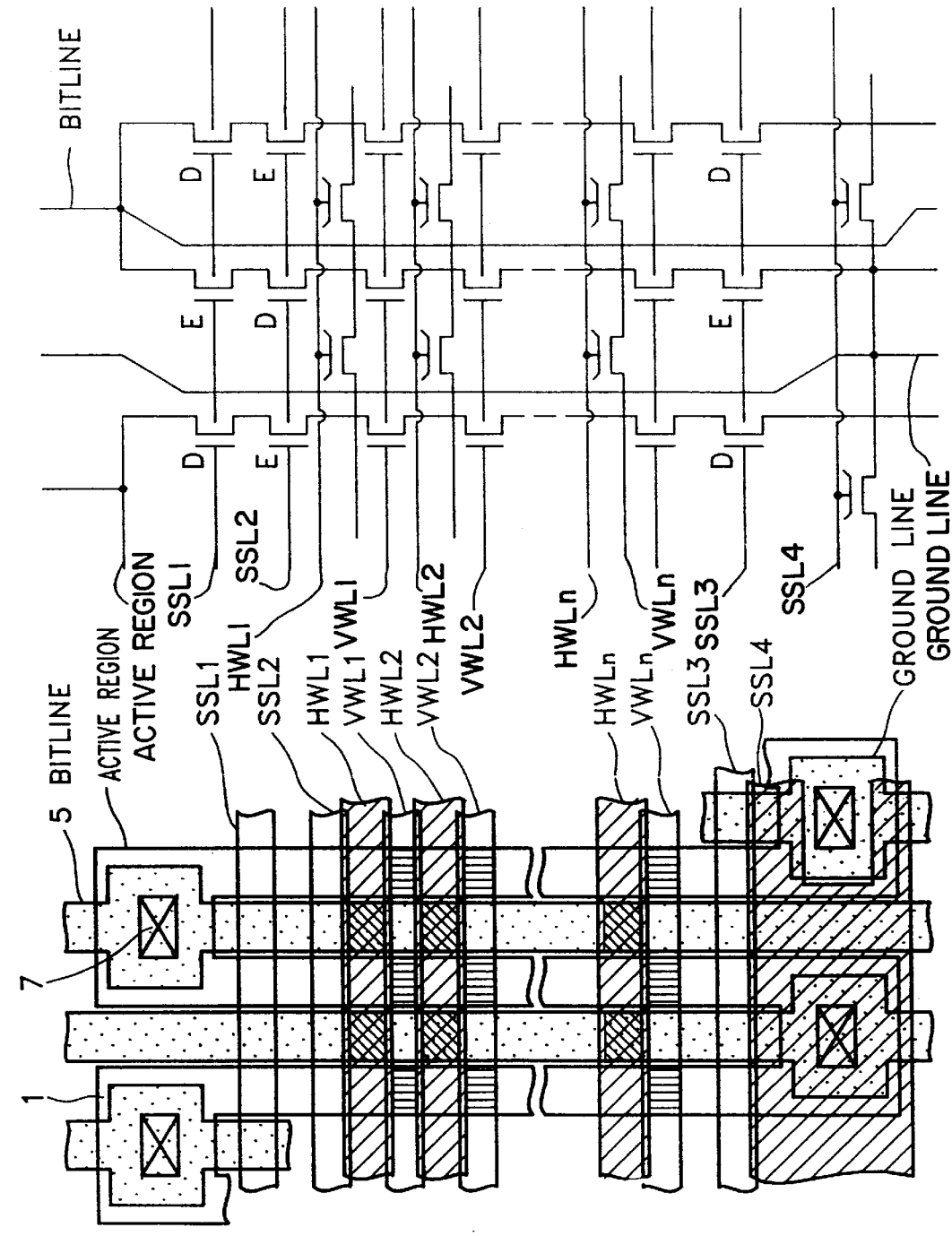

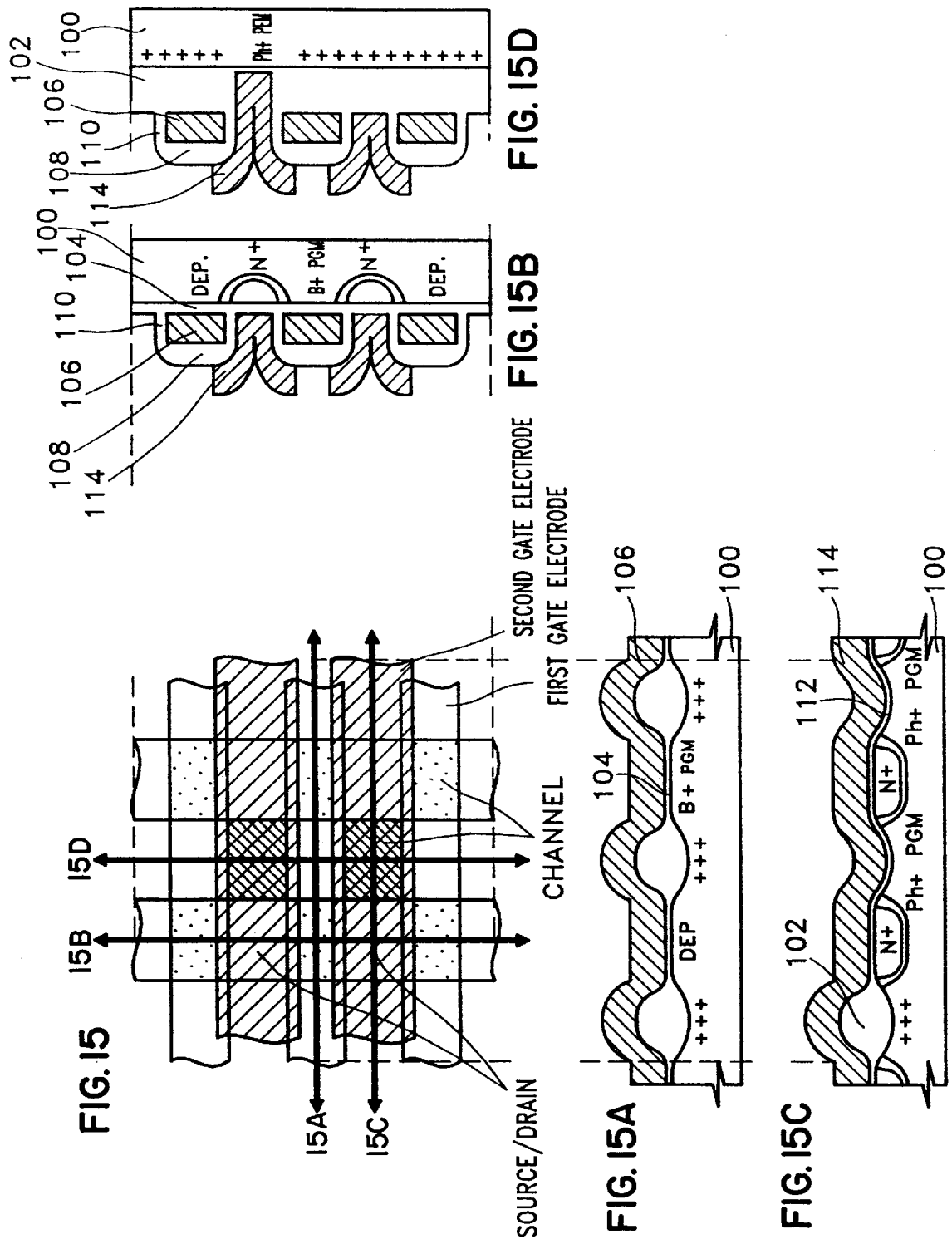

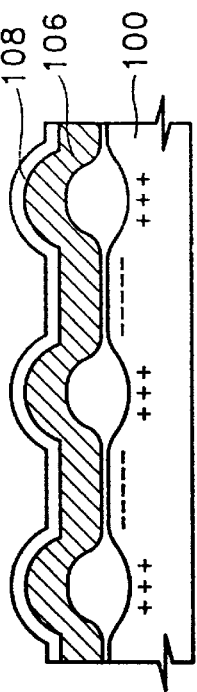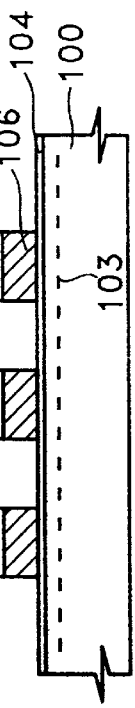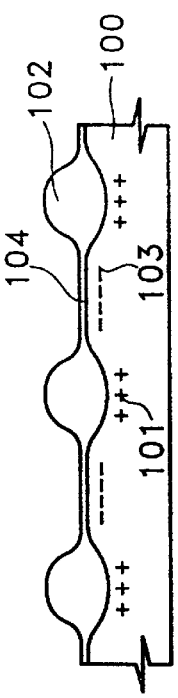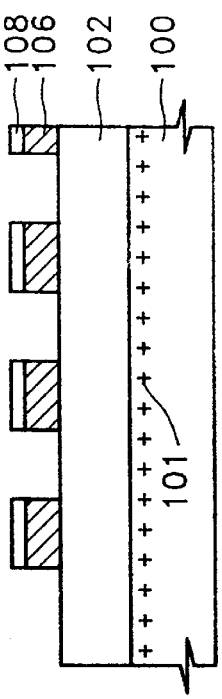
FIG.17A  FIG.17B  FIG.17C  FIG.17D
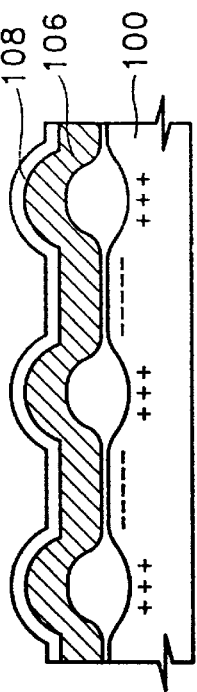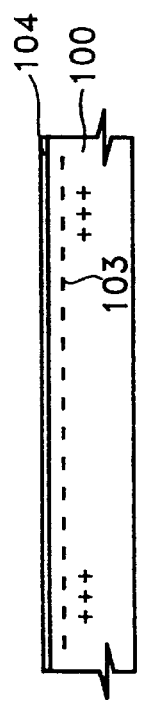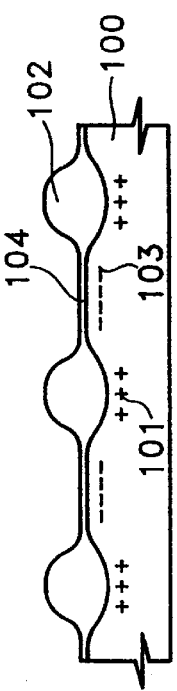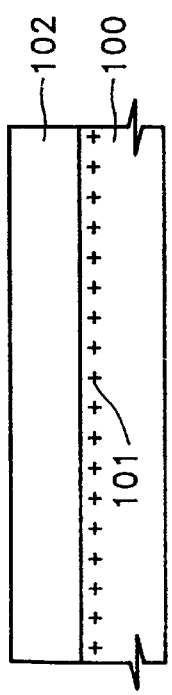
FIG.16A  FIG.16B  FIG.16C  FIG.16D

METHOD FOR MANUFACTURING A SEMICONDUCTOR ROM DEVICE

This is a division of application Ser. No. 08/604,785, filed Feb. 23, 1996, U.S. Pat. No. 5,721,698.

BACKGROUND OF THE INVENTION

The present invention relates to a semiconductor memory device and a method for manufacturing the same, and more particularly, to a read only memory (ROM) device ensuring high speed operation, excellent yield, and integration enhancement.

For high-integration of a semiconductor device, the area of each memory cell must be reduced.

A NAND-type memory cells used for a nonvolatile memory device, in particular, for a flash memory or a mask ROM, is formed having a structure where two strings of one bit line contact, connected in series to a plurality of cells, are repeatedly arranged facing each other.

FIGS. 1 and 2 are views of a layout and an equivalent circuit of a mask ROM of the aforementioned conventional single NAND type. Here, reference numeral 1 denotes an $N^+$ active region used for the source/drain of a transistor, 2 denotes an ion-implanted region for a depletion type channel, 3 denotes a conductive layer used for connecting the gate electrode of the transistor and a chip's interior, 4 denotes a contact for electrically connecting the active region and a metal layer, or the conductive layer and the metal layer, and denotes a metal layer used as a connector. SSL1 and SSL2 denote gate electrodes of a first and a second string select transistors, respectively, and $WL_1, \ldots WL_{n-1}$, $WL_n$ denote word lines. Here, the gate electrode and conductive layer are formed of a single layer of polysilicon or metal polycide.

As shown in FIGS. 1 and 2, one string is formed between a bit line (B/L) and a ground line. In the string, a plurality of cell transistors, namely 8, 16 or 32 cell transistors are in serial connection with the first and the second string select transistors of the same length as that of a cell transistor. Two strings connected in parallel to a ½ B/L contact form a reference unit of the memory cell array. Here, one of the two string select transistors in one string is an NMOS transistor (see "E") having an enhancement type channel, the other is an NMOS transistor (see "D") having a depletion type channel.

In the operation of the single NAND type mask ROM, a read voltage of approximately 1V~Vcc is supplied to a selected B/L, Vcc is supplied to a gate electrode of an enhancement type string select transistor (E) of a selected string, and 0V is supplied to a gate electrode of a depletion type string select transistor (D). Thereafter, when 0V is supplied to a selected wordline of cell transistors, constituting the selected string, and Vcc is supplied to a non-selected wordline thereof, "OFF" and "ON" is sensed as the voltage supplied to the B/L is blocked from being discharged if the enhancement type cell transistor is selected, and read voltage is discharged to the ground line if the depletion type cell transistor is selected.

The aforementioned single NAND type mask ROM has the advantages that integration can be increased by in series connecting cell transistors, and manufacturing cost is cut due to a simple manufacturing process. Views of a layout and an equivalent circuit of a double NAND type mask ROM, where integration of the mask ROM is further enhanced over the single NAND type are disclosed in FIGS. 3 and 4.

As shown in FIGS. 3 and 4, a double NAND type mask ROM has increased integration of two times over that of the single NAND type mask ROM when the same design rule is used. The increase in integration occurs, because the double NAND type mask ROM does not form $N^+$ source/drain on an $N^+$ source/drain region of a cell transistor having a first gate electrode but forms a second gate electrode. Here, the second gate electrode is positioned between and partially overlapped on the first gate electrode. The operating principle of the double NAND type mask ROM double NAND type is similar to that of the single NAND type mask ROM, as mentioned above.

However, the double NAND type mask ROM has the following problems.

First, as the number of cell transistors is increased, channel resistance is increased, and an overlap margin problem between the first gate electrode and the second gate electrode is generated. Further, a potential barrier reduces cell current discharged from a B/L to a ground line to thereby limit the operational speed, because ion-implantation into the $N^+$ source/drain is not performed.

Second, when the gate electrodes of a cell transistor using a minimum design rule are formed, there are difficulties in ensuring a mis-align margin of the first gate electrode, because of an element due to a line/space ratio, and consequently the integration of the cell is not so increased as that of a mask ROM of a single NAND type.

Third, a depletion type mode should be programmed to an enhanced type mode by ion-implanting through two steps: a programming step before or after forming the first gate electrode to secure adequate margin for misalignment and process; and another programming step before or after forming the second gate electrode. When a cell transistor having the first gate electrode is programmed, a channel of a cell transistor having the second gate electrode is exposed at the edge of the first gate electrode so that an ion-implantation interference phenomenon is generated, to thereby lower the uniformity of cell current.

Fourth, a self-aligned channel length of the second gate electrode is determined by forming the first gate electrode such that a channel length of the second gate electrode is reduced when the first gate electrode is longer. Accordingly, the characteristics of the cell transistors using first and second gate electrodes in a memory cell array differ and a process margin is reduced.

Fifth, when a thickness of an interlayer dielectric film for insulating first and second gate electrodes is formed as thinly as possible for ensuring the punch margin of a cell under a minimum design rule, delay and leakage current of a word-line are generated by interlayer capacitance.

Meanwhile, views of a layout and an equivalent circuit of a mask ROM having a flat cell NOR type structure proposed by Sharp Company Ltd. of Japan are shown in FIGS. 5 and 6 (see Japanese Patent Application No. 90-285594).

In FIGS. 5 and 6, reference numeral 51 denotes a burial diffusion layer which serves as a source/drain of a cell transistor, 52 denotes a channel region of the cell transistor, 53 denotes a wordline that is perpendicularly arranged to the burial diffusion layer, and 54 denotes a bank selector. The NOR type flat cell has increased integration with most cell arrays having an active region and the usual characteristics of a NOR type cell, in which each cell is in a parallel connection between the bitline and the ground line. Burial diffusion layer 51 electrically connects source (S) to source (S), drain (D) to drain (D). Bank selectors (54) are deposited on and under the burial diffusion layer so that a cell transistor is selected and therefore the selected cell transistor's source/drain are also selected. The aforesaid mask ROM having the NOR type flat cell structure is a matrix extending along a colume line having banks separated from each column of the memory cell array as represented by $B_{m2i-1}$, $B_{m2i}$, $B_{m2i+1}$ ... in dash-lined area. Here, reference character "$B_m$" or "$B_i$" indicates that "B" is located in a column line of "m" or "i". One set of banks are formed of an uneven number bank and an even number bank such as $B_{m2i-1}$ and $B_{m2i}$. Sub bitlines such as $SB_{m2i-2}$, $SB_{m2i-1}$, $SB_{m2i}$, $SB_{m2i+1}$ ... are arranged between adjacent banks located in a direction of a row line, and each sub bitline "SB" is connected to each memory cell "M" of the adjacent bank "B", the memory cell having a MOSFET and being selected by a wordline of $WL_1$, ... $WL_n$. The upper and lower portions of sub bitline $SB_{m2i}$ are connected to a main bitline $MB_1$ at nodes of $XO_{mi}$ and $XE_{mi}$. Three sub bitlines linked with another set of banks are also connected to a main bitline adjacent to each set in the same manner. The sub bitline "SB" and nodes "XO" and "XE" are constituted by a burial diffusion layer, a wordline "WL", bank select lines "BO" and "BE" of a polysilicon layer, and a main bitline "MB" of a metal layer. All memory cells are formed under a wordline "WL" between sub bitlines located along a row line close to each other. "QO" and "QE" of bank selector MOSFETs are formed between a conversion portion of nodes "XO" and "XE" and a sub bitline "SB", respectively, the burial diffusion layer and a metal layer (a main bitline "MB") are connected through a contact hole on each node "XO" and "XE".

In operation of the mask ROM having a flat cell NOR type structure, constant voltage is supplied to a selected bitline, 0V to an adjacent bitline (or a ground line), a non-selected bank selector, and a non-selected wordline, while Vcc is supplied to a selected bank selector and a selected wordline. Here, the threshold voltage (Vth) for turning "ON" a cell transistor is to be lower than Vcc, and for turning "OFF" higher than Vcc.

The mask ROM having a flat cell structure of the NOR type has an advantage that the cell current flowing from the bitline to the ground line is higher than that of a mask ROM of the NAND type. However, integration of the cell is lower than that of a mask ROM of the O NAND type due to the burial diffusion layer having a large area. The selected wordline, by Vcc, also has the disadvantage of reduced operation speed due to a very large bitline loading capacitance generated when an "ON" cell of a non-selected bitline is turned-on.

SUMMARY OF THE INVENTION

Accordingly, it is an object of the present invention to provide a semiconductor memory device wherein high speed operation and excellent yield are enabled by solving the problems of conventional mask ROMs of both the NAND type and of the NOR type.

It is another object of the present invention to provide an appropriate method for manufacturing the semiconductor memory device.

To accomplish the above object of the present invention, there is provided a semiconductor memory device comprising: a plurality of active regions repeatedly formed extending in parallel with each other and a device isolation region; a plurality of first gate electrodes repeatedly arranged to be perpendicular to the active region and the device isolation region; source/drain formed by self-aligned ion-implantation into the first gate electrode, an active region, and a device isolation region; and a second gate electrode located between the first gate electrodes extending in parallel to the first gate electrodes, and sharing the source/drain with the first gate electrode, and using the device isolation region as a channel.

To accomplish another object of the present invention, there is provided a read only memory (ROM) comprising: a first and a second string select transistor connected in series to a bitline and formed of depletion type and enhancement type transistors; a plurality of first cell transistors connected in series between the first and second string select transistors and a ground line separated by the bitline unit; a plurality of second cell transistors connected in parallel between one string consisting of the first and second string select transistors and the plurality of first cell transistors and the other string adjacent to the former string; and at least one string select transistor connected in series between a plurality of the first cell transistors and ground line, in order to select a plurality of the second cell transistors connected in parallel.

The plurality of second cell transistors share a source/drain region with the plurality of first cell transistors having channel region repeatedly arranged in parallel between the strings.

It is preferable that a threshold voltage of the enhancement type string select transistor is 0.5V~2.0V. Preferably, in the plurality of first cell transistors, a threshold voltage of an "ON" cell transistor is 0~-10V, and a threshold voltage of an "OFF" cell transistor is 0.5~(Vcc-1)V. Preferably, in the plurality of second cell transistors, a threshold voltage of an "ON" cell transistor is 0.5~(Vcc-1)V, and a threshold voltage of an "OFF" cell transistor is Vcc~(Vcc+10)V.

To accomplish another object of the present invention, there is provided a method for manufacturing a semiconductor memory device comprising the steps of: determining a device isolation region and an active region by forming a device isolation film on a semiconductor substrate; implanting ions of a first conductivity type on the whole surface of the resultant structure in order to initialize a cell transistor to a depletion type; sequentially forming a first gate dielectric film and a first gate electrode having the upper portion capped with a first insulating layer; forming a source/drain self-aligned onto the first gate electrode on the active region of the substrate; implanting ions of a second conductivity type for programming a first cell transistor which uses the first gate electrode; programming a device isolation region between a region where a second gate electrode is to be formed and the first gate electrode; and sequentially forming a second gate dielectric film and a second gate electrode using the programmed device isolation region as a channel on the resultant structure.

It is preferable that the second gate electrode is formed of polysilicon doped with an impurity or metal polycide. The first gate electrode can be also formed of metal polycide, the second gate electrode can be formed of polysilicon doped with an impurity. Here, for a metal of the metal silicide, a rare-earth metal such as tungsten (W), titanium (Ti), tantalum (Ta), or molybdenum (Mo) is used.

According to a preferred embodiment of the present invention, it is preferable that the step of programming a device isolation region between a region where a second gate electrode and a first gate electrode are to be formed comprises the steps of: eliminating the device isolation film between a region where a second gate electrode and the first gate electrode are to be formed by a lithographic process; and implanting ions of a first conductivity type into the resultant structure. Here, it is preferable that the device isolation film is eliminated by dry-etching.

According to another preferred embodiment of the present invention, the step of programming a device isolation region between a region where a second gate electrode and a first gate electrode are to be formed comprises the steps of implanting ions of a first conductivity type into the device isolation region between a region where a second gate electrode and a first gate electrode are to be formed.

The step of forming a source/drain comprises the steps of: performing LDD ion-implantation on the whole surface of the resultant structure where the first gate electrode is formed; forming a spacer consisting of a second insulating layer on the sidewalls of the first gate electrode; and performing ion-implantation into the source/drain using the first gate electrode and the spacer as an ion-implantation mask. In the step of forming a spacer, the first insulating layer should be left on the upper portion of the first gate electrode.

According to the present invention, a usual single NAND structure is further provided by a second gate electrode having a horizontal channel which easily ensures adequate process margin, so that cell integration is enhanced and a high speed operation is enabled.

BRIEF DESCRIPTION OF THE DRAWINGS

The above objects and advantages of the present invention will become more apparent by describing in detail a preferred embodiment thereof with reference to the attached drawings in which:

FIGS. 7 and 8 are views of a layout and an equivalent circuit of a mask ROM of a NAND-NOR type according to an embodiment of the present invention;

FIGS. 11 and 12 are views of a layout and an equivalent circuit of a mask ROM of a NAND-NOR type according to another embodiment of the present invention;

FIGS. 15A–15D is a sectional view showing a cell structure and a vertical structure by each portion of a mask ROM of a NAND-NOR type according to the present invention;

FIGS. 16A–16D, 17A–17D, 18A–18D, 19A–19D, 20A–20D, and 21A–21D are sectional views for illustrating a method for manufacturing a mask ROM of a NAND-NOR type according to an embodiment of the present invention.

DETAILED DESCRIPTION OF THE INVENTION

Figure 2:
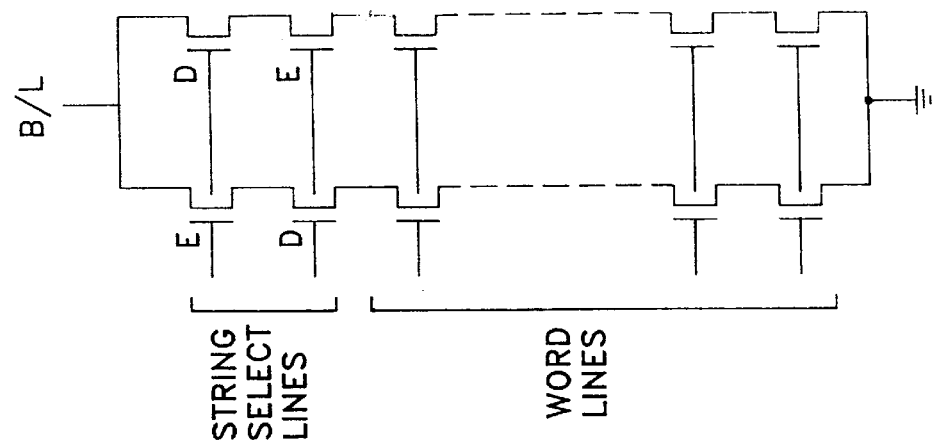
FIGS. 1 and 2 are views of a layout and an equivalent circuit of a mask ROM of a conventional single NAND type.

A mask ROM according to the present invention (a mask ROM of a NAND-NOR type) will now be described in detail.

FIGS. 7 and 8 are views of a layout and an equivalent circuit of a mask ROM of a NAND-NOR type according to an embodiment of the present invention.

In FIGS. 7 and 8, reference numeral 71 denotes an N$^+$ active region used for the source/drain of a transistor. Reference numerals 72, 73 and 74 denote first, second and third string select lines (SSL1, SSL2, and SSL3) having a structure where an enhancement channel (E) and a depletion channel (D) are alternately arranged, having two lines in the upper portion and one line in the lower portion or vice versa. Reference numeral 75 is a metal layer used as a bitline, 76 is a metal layer used as a ground line, and 77 is a contact for electrically connecting the metal layers to the N$^+$ active region. Reference numeral 78 is a vertical channel wordline (VWL) of a first cell transistor, that is, a first gate electrode arranged in number sequence 1, 2, 3, ..., n–1, n, and formed of polysilicon or metal polycide, where "n" denotes 8, 16, 32 and so on. Reference numeral 79 is a horizontal channel wordline (HWL) of a second cell transistor, or a second gate electrode, and formed of polysilicon or metal polycide as many as the number of the VWL. Reference numerals 80 and 81 denote channel regions of first and second cell transistors formed of first and second gate electrodes (VWL and HWL), respectively.

Figure 1:
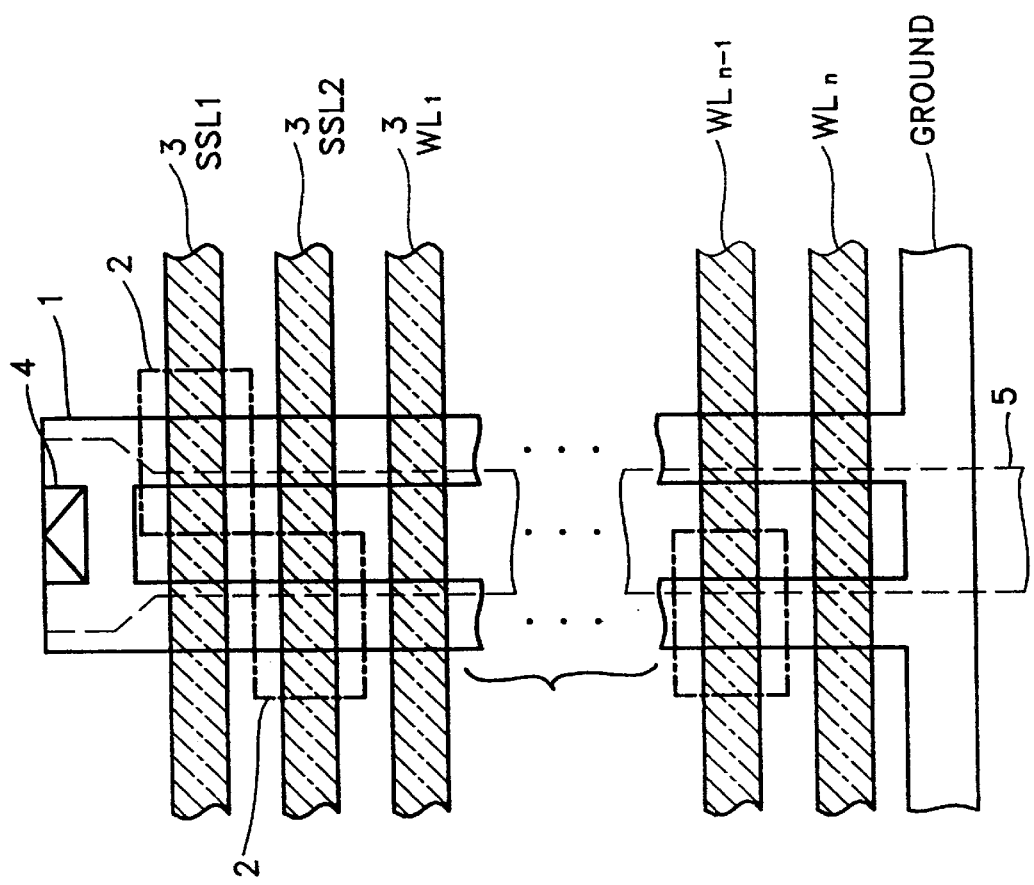

Unlike the mask ROM of a conventional single NAND type shown in FIGS. 1 and 2, the mask ROM of a NAND-NOR type according to the present invention has ground lines separated by each bitline unit with respect to each string, a first cell transistor using a first gate electrode (VWL) that is extended in a direction of a string and a second cell transistor using a second gate electrode (HWL) sharing an N$^+$ source/drain region of the first cell transistor are formed on a device isolation region between the strings.

Figure 4:
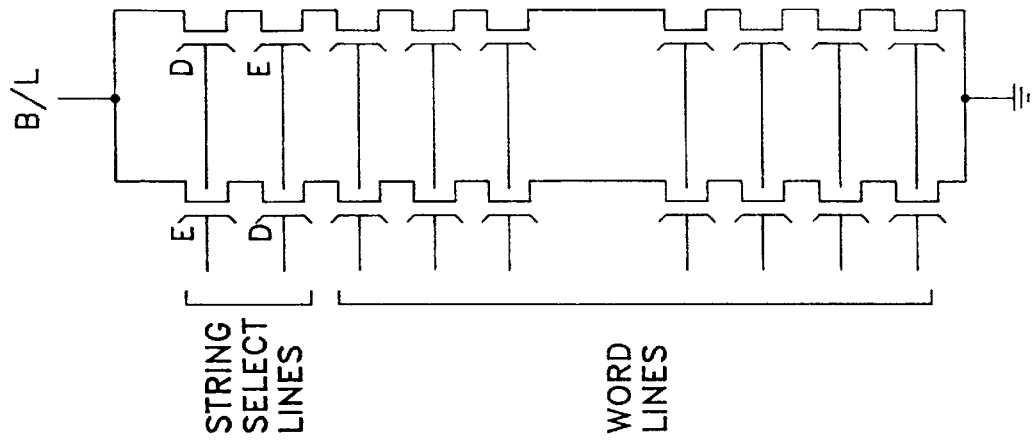
FIGS. 3 and 4 are views of a layout and an equivalent circuit of a mask ROM of a conventional duplicate NAND type.
Figure 3:
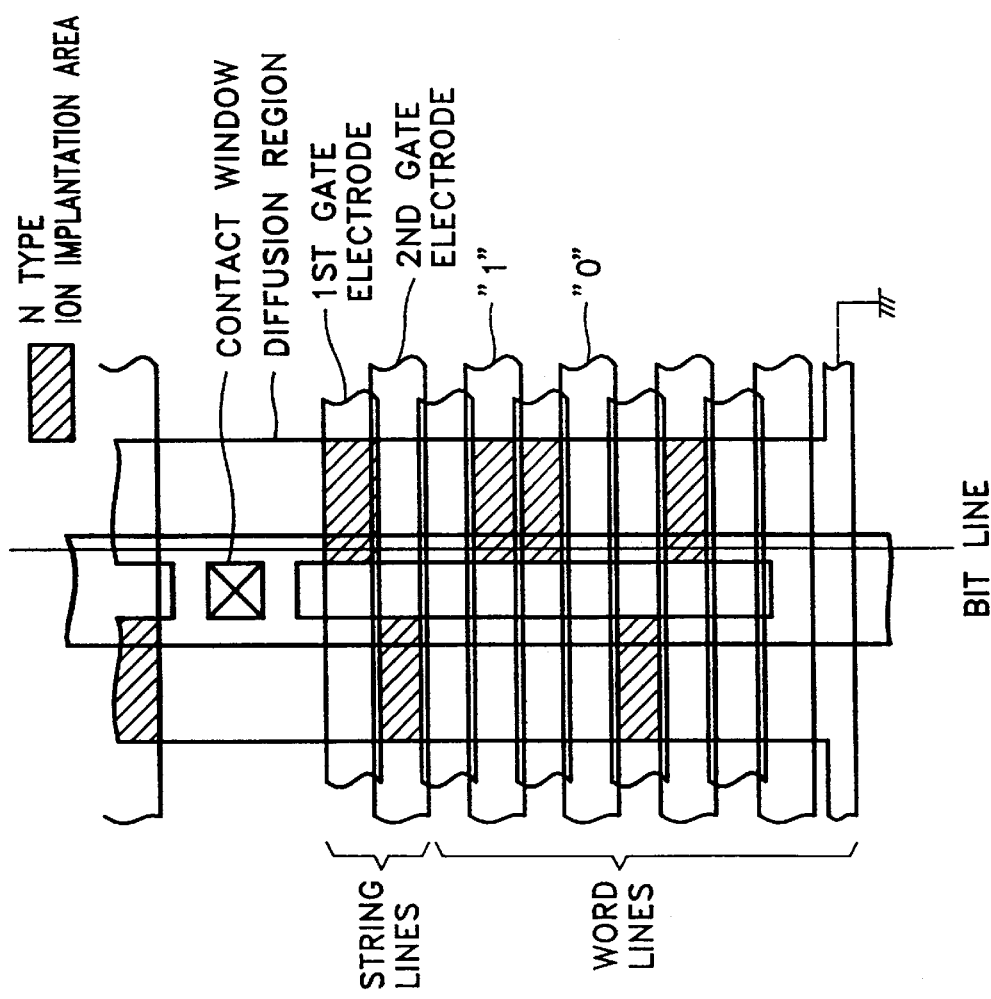

Compared with the mask ROM of the conventional duplicate NAND type shown in FIGS. 3 and 4, in a mask ROM of a NAND-NOR type according to the present invention, an N$^+$ source/drain region of the first cell transistor using the first gate electrode (VWL) that lies in a direction of a string, that is, in a vertical direction, is located below the second gate (HWL), and channel region 81 of the second cell transistor using the second gate electrode (HWL) is repeatedly arranged in a horizontal direction between strings.

Figure 10:
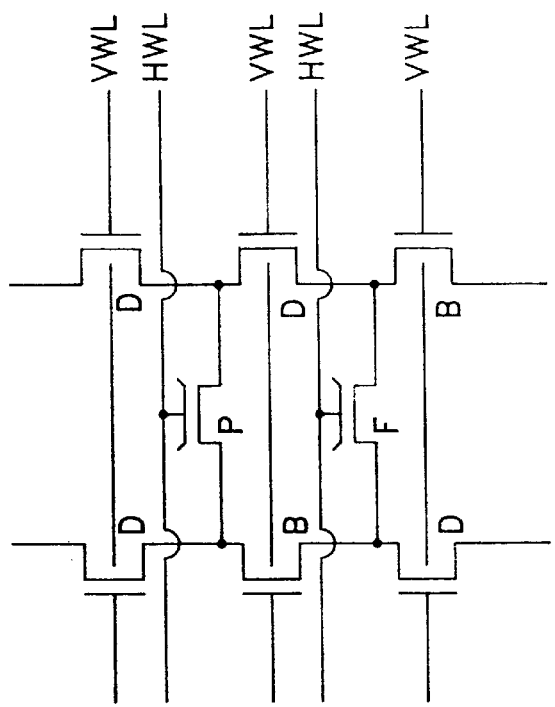
FIGS. 9 and 10 are views of a layout and an equivalent circuit of a cell structure of a mask ROM of a NAND-NOR type according to an embodiment of the present invention.
Figure 9:
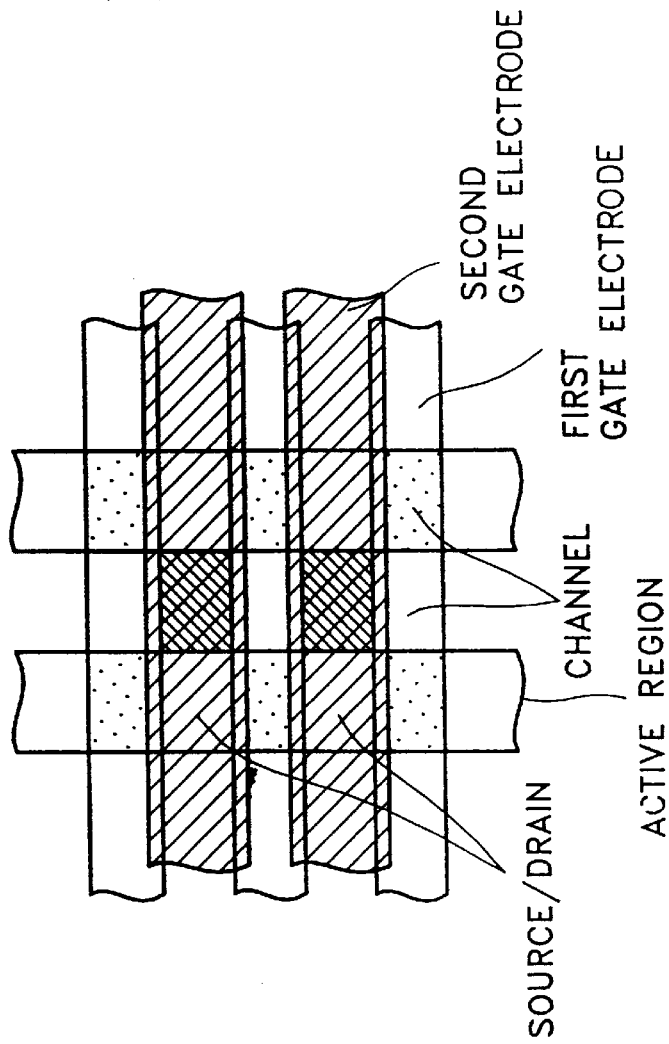

FIGS. 9 and 10 are views of a layout and an equivalent circuit of a cell structure of a mask ROM of a NAND-NOR type according to an embodiment of the present invention.

Referring to FIGS. 9 and 10, a cell of a mask ROM of a NAND-NOR type according to the present invention consists of a first gate electrode, i.e., a first cell transistor extended in a vertical direction by a first wordline VWL1, VWL2, ... VWLn, and a second cell transistor which is extended in a horizontal direction by a second gate electrode, that is, the second wordline HWL1, HWL2, ... HWLn, sharing an N$^+$ source/drain region with the first cell transistor, the N$^+$ source/drain formed and self-aligned by an N$^+$ active region. Here, an "ON"-cell of the first cell transistor formed in a vertical direction by the VWL1, VWL2, ..., VWLn is an NMOS transistor of the depletion type (see "D"), an "OFF"-cell is an NMOS transistor of the enhancement type having a Vth of approximately 0.5~2.0V (see "B"). The NMOS transistor of the enhancement type "B" is programmed by ion-implanting boron. An "ON"-cell of the second cell transistor formed in a horizontal direction by HWL1, HWL2, ..., HWLn is programmed by ion-implanting phosphorus (P) or arsenic (As) and has a Vth of 0.5~(Vcc–1)V (see "P"), and an "OFF"-cell is a field transistor and has a Vth equal to or more than (Vcc+1)V (see "F").

Figure 5:
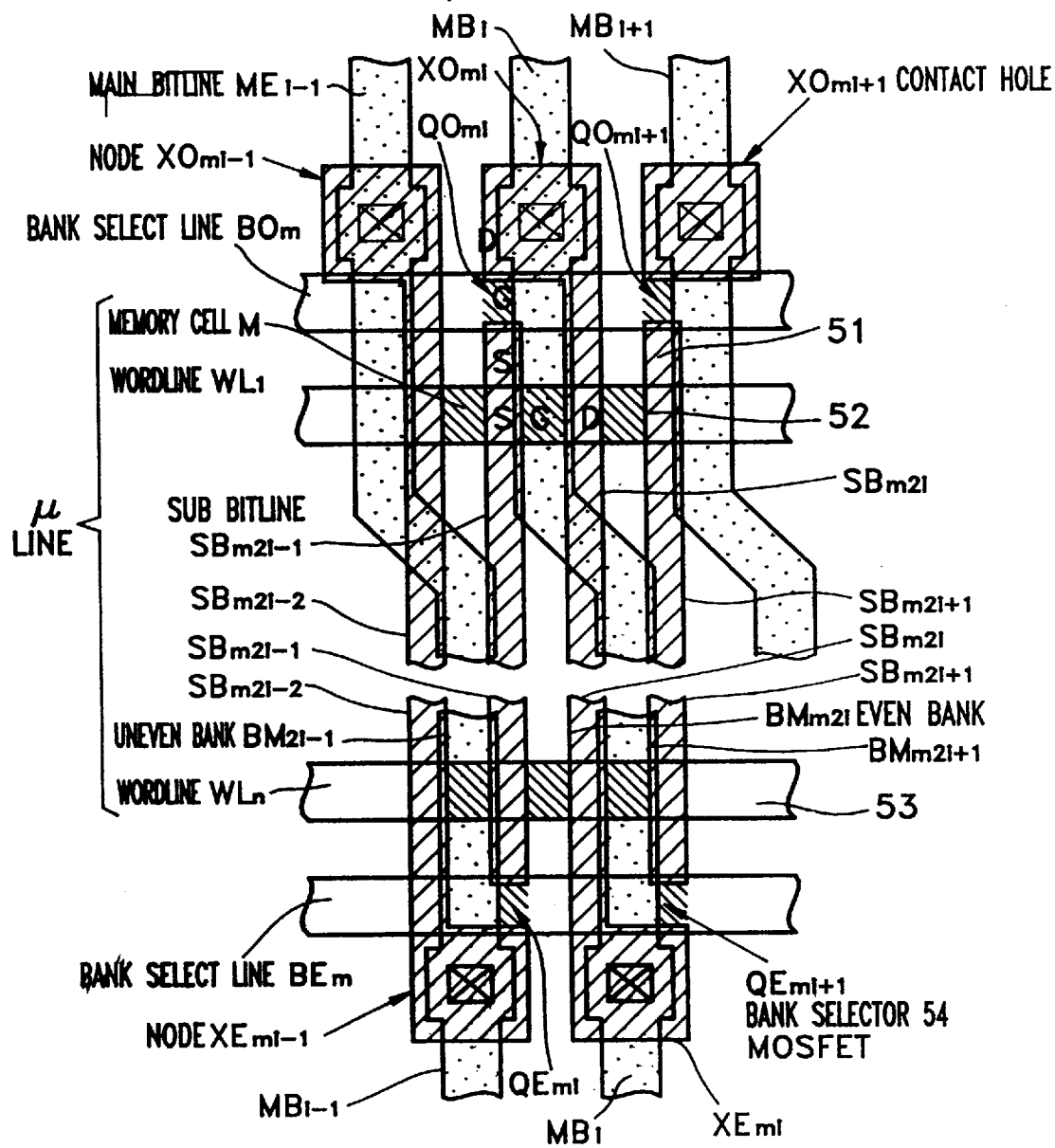
FIGS. 5 and 6 are views of a layout and an equivalent circuit of a mask ROM having a flat cell structure of a conventional NOR type.
Figure 6:
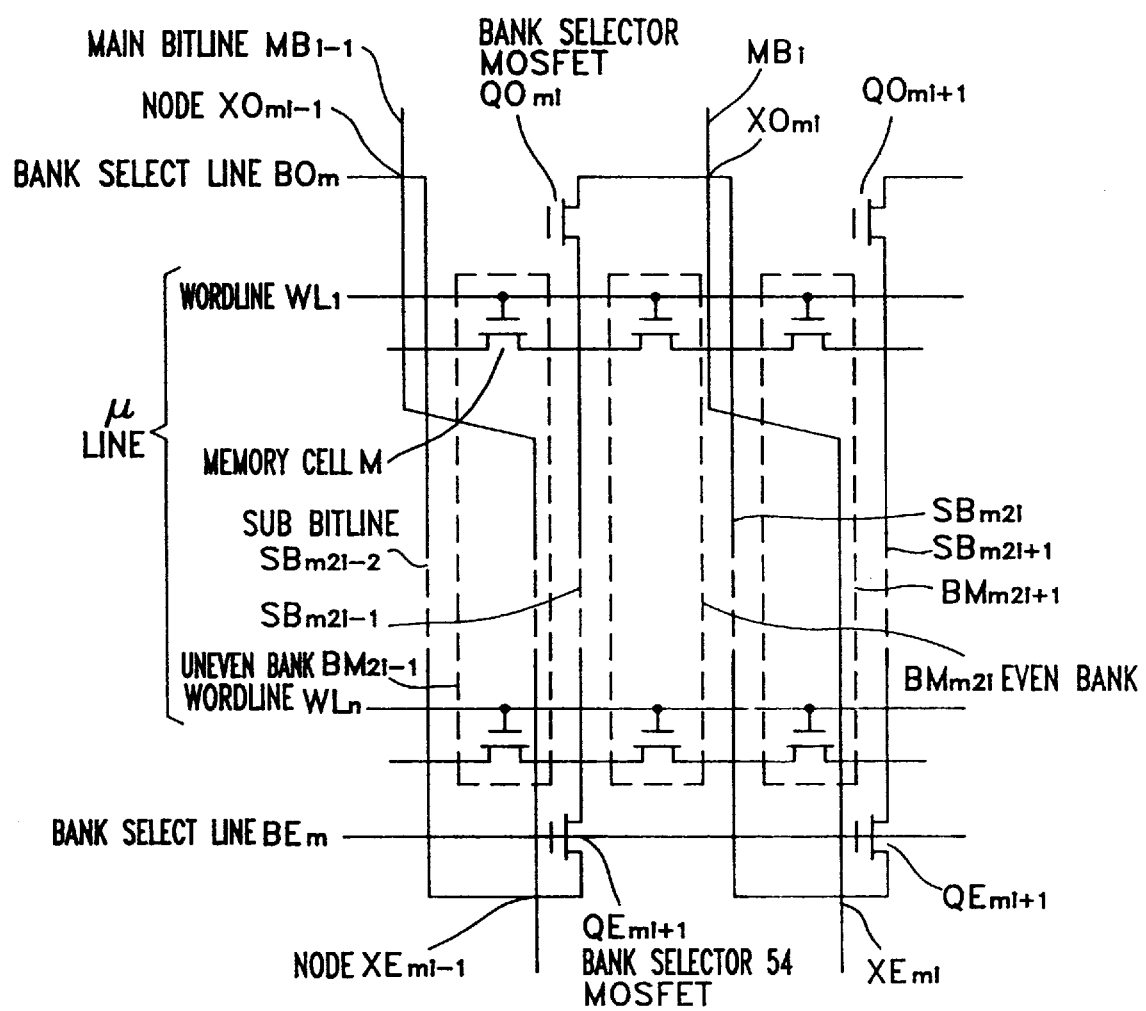

The mask ROM of a NAND-ROM type, according to the present invention, duplicates the operation of the mask ROM of a single NAND type shown in FIGS. 1 and 2 and operation of the mask ROM of a flat cell of a NOR type shown in FIGS. 5 and 6. Its operation will be described in detail with reference to FIGS. 7 and 8.

A voltage of 1V~Vcc is supplied to a selected bitline, 0V to an adjacent ground line. When a selected wordline is a vertical channel wordline VWL1, VWL2, . . . , VWLn, Vcc is supplied to a third string line (SSL3), 0V or Vcc in turn is supplied to first and second string lines (SSL1 and SSL2) according to the selected string. 0V is supplied to a selected wordline (VWL), Vcc to a non-selected wordline (VWL), and 0V to the other horizontal channel wordlines HWL1, HWL2, . . . , HWLn. Accordingly, when a selected vertical channel wordline (VWL) is 0V, "ON" or "OFF" is read by sensing a current discharged from a bitline to a ground line according to the type of cell transistor, i.e., a depletion type or an enhancement type. When a selected wordline is a horizontal channel wordline HWL1, HWL2, . . . , HWLn, Vcc is supplied to a second string select line (SSL2), 0V and Vcc are in turn supplied to first and third string select lines (SSL1 and SSL3) by a selected bank. Vcc is supplied to a selected wordline (HWL), 0V to a non-selected wordline (HWL), and Vcc to other vertical channel wordlines VWL1, VWL2, . . . VWLn. Accordingly, a current discharged from a bitline to a ground line can be sensed.

FIGS. 11 and 12 are views of a layout and an equivalent circuit of a mask ROM of a NAND-NOR type according to another embodiment of the present invention.

FIGS. 11 and 12 show structures adding a fourth string select line (SSL4) to structures shown in FIGS. 7 and 8. The fourth string select line (SSL4) serves to make the same codings of a bitline and a ground line when a vertical channel wordline (VWL) or a horizontal channel wordline (HWL) is selected in the aforementioned operation. When the vertical channel wordline (VWL) is selected, Vcc is supplied to the fourth string select line (SSL4) and when the horizontal channel wordline (HWL) is selected, 0V is supplied. The fourth string select line (SSL4) is formed of polysilicon or polycide which constitute the second gate electrode.

Figure 13:
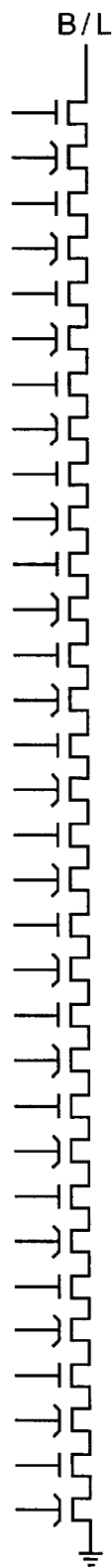
FIGS. 13 and 14 are schematic views showing each path of cell circuits of a mask ROM of a NAND-NOR type according to the present invention and of a mask ROM of a conventional duplicate NAND type, respectively.
Figure 14:
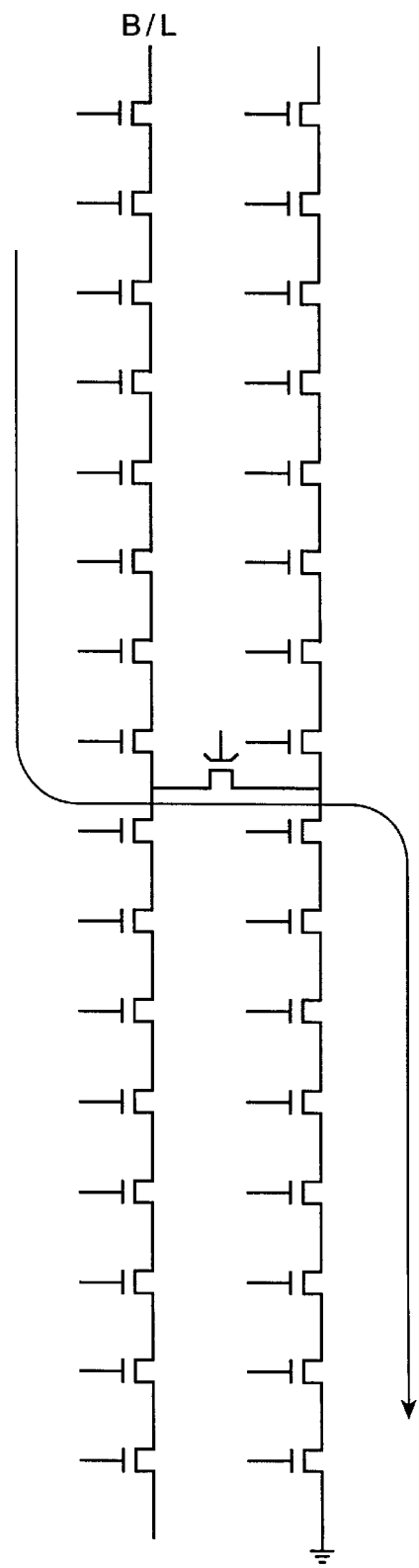
Figure 18A:
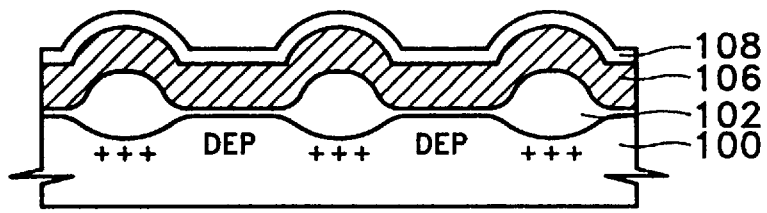
Figure 18B:
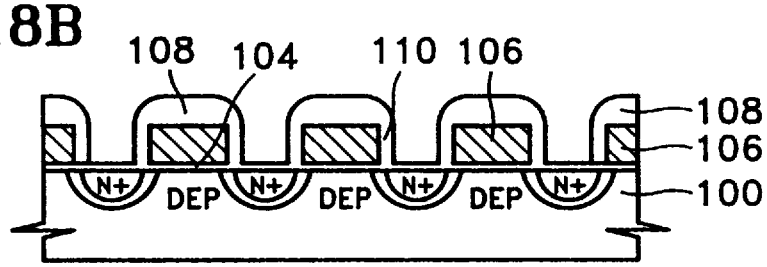
Figure 18C:
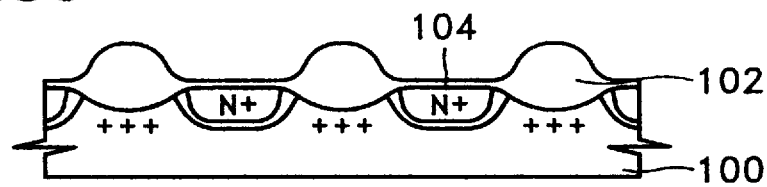
Figure 18D:
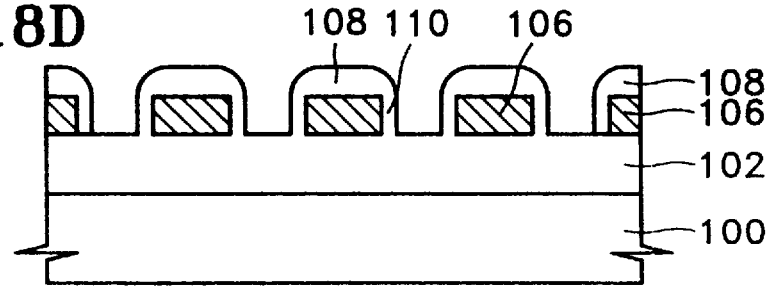
Figure 19A:
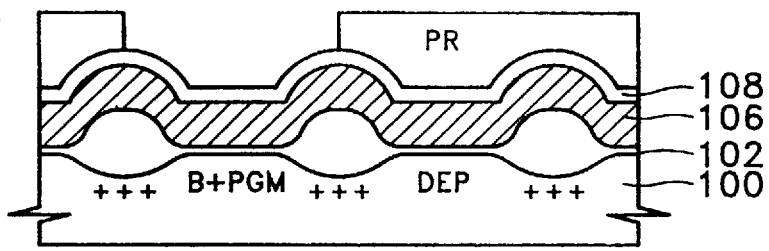
Figure 19B:
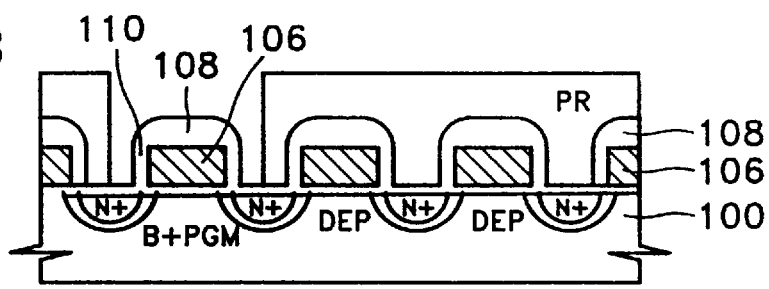
Figure 19C:
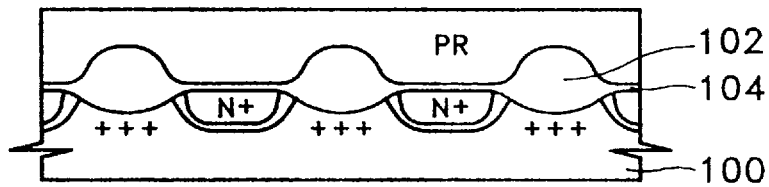
Figure 19D:
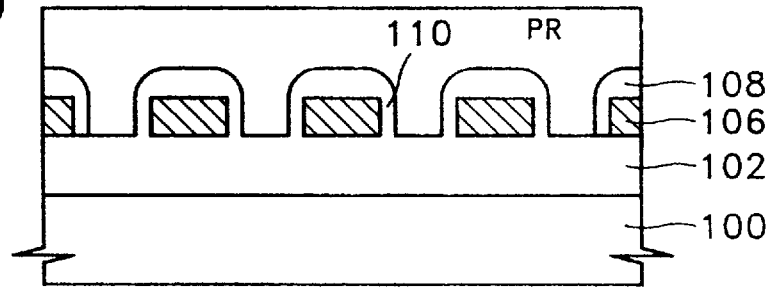
Figure 20A:
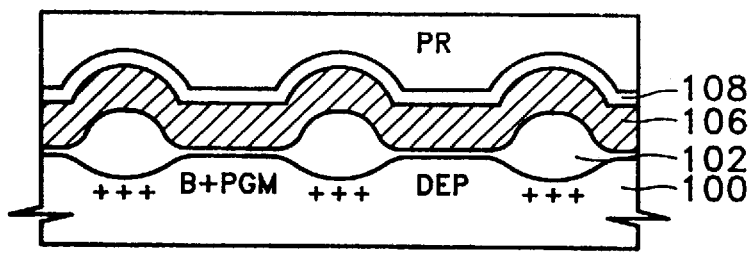
Figure 20B:
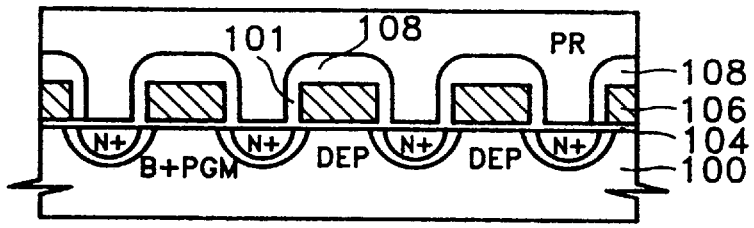
Figure 20C:
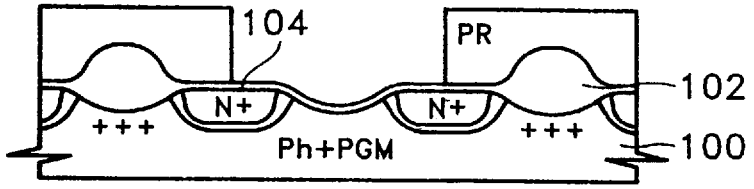
Figure 20D:
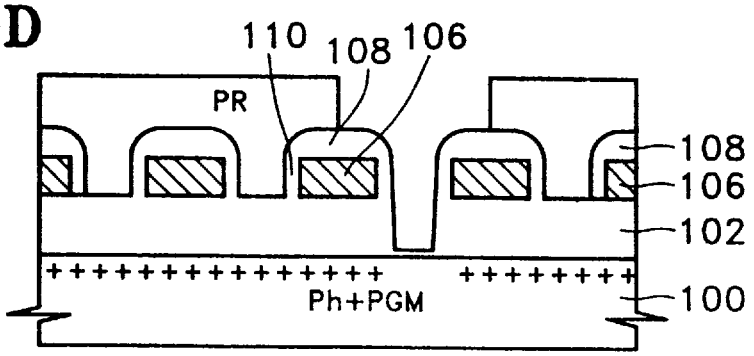
Figure 21A:
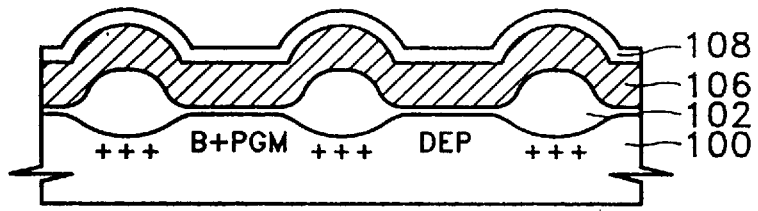
Figure 21B:
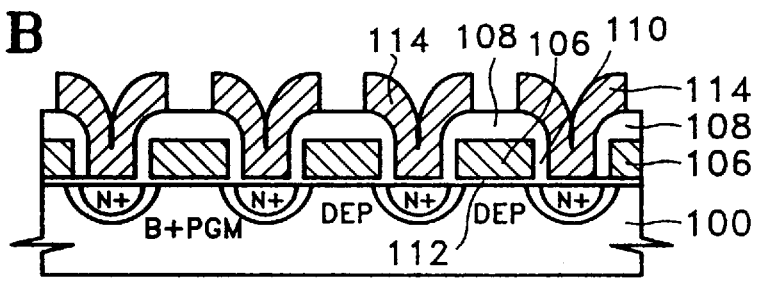
Figure 21C:
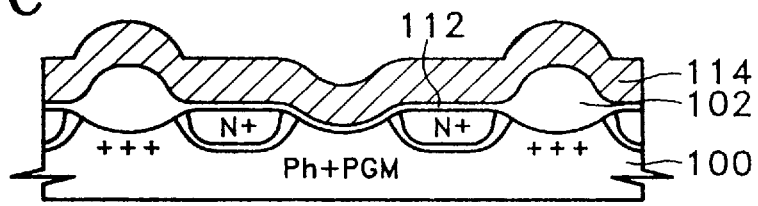
Figure 21D:
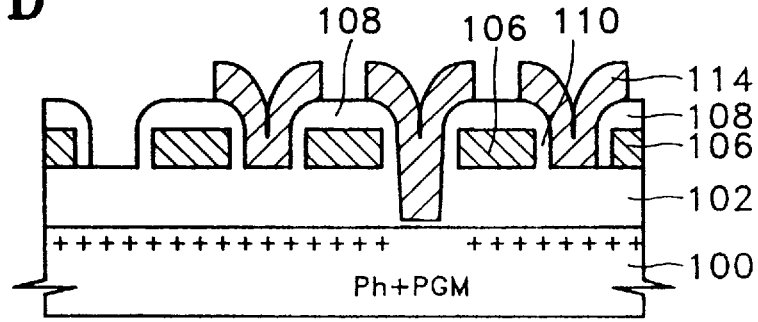
Figure 22A:
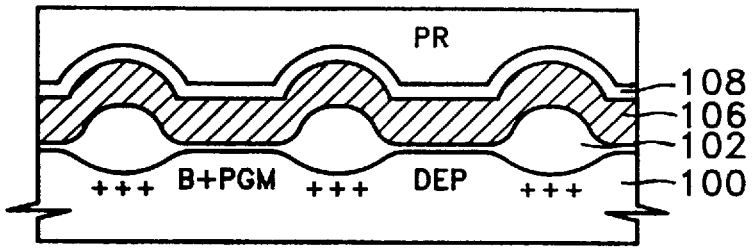
FIGS. 22A–22D, and 23A–23D are sectional views for illustrating a method for manufacturing a mask ROM of a NAND-NOR type according to another embodiment of the present invention.
Figure 22B:
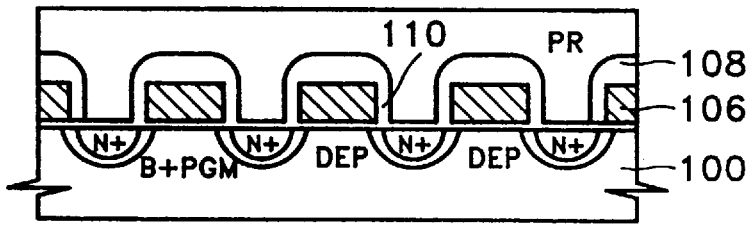
Figure 22C:
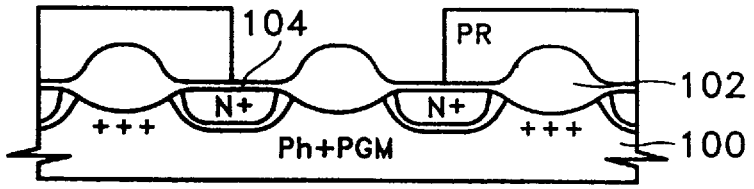
Figure 22D:
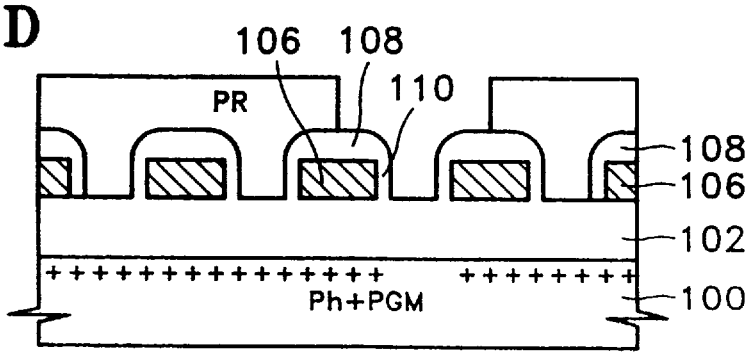
Figure 23A:
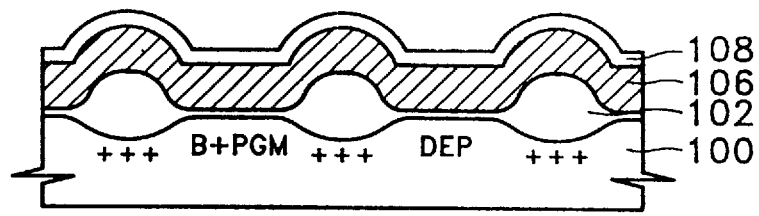
Figure 23B:
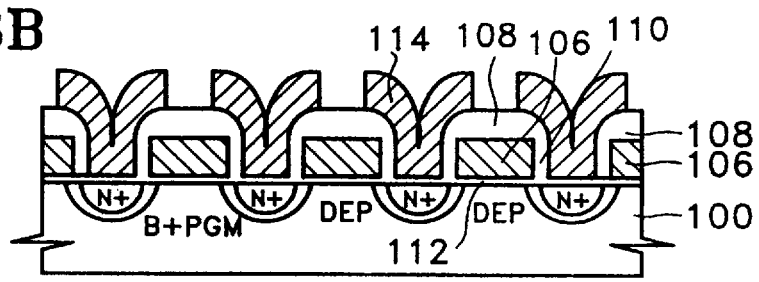
Figure 23C:
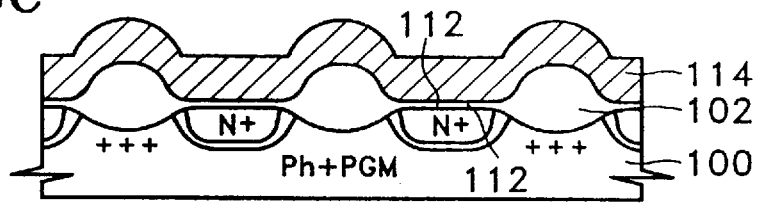
Figure 23D:
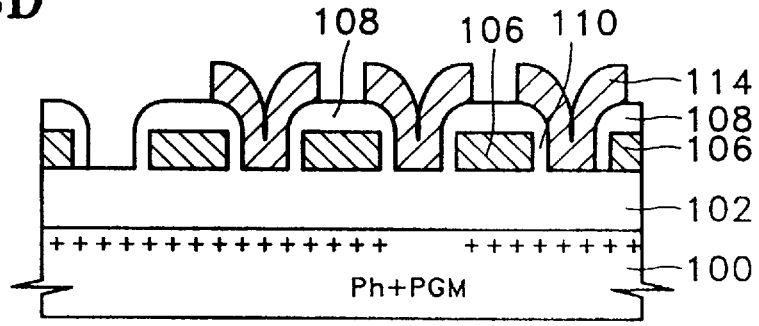

FIGS. 14 and 13 are schematic views showing the route of the cell current in a mask ROM of a NAND-NOR type, according to the present invention, and that in a mask ROM of a conventional NAND type, respectively.

As shown in FIGS. 13 and 14, while 32 cell transistors are connected in series in a mask ROM of a conventional duplicate NAND type, where n=16, 17 cell transistors are connected in series in a mask ROM of a NAND-NOR type according to the present invention. That is, a string and a unit cell can be calculated as follows by the conventional mask ROM of a duplicate NAND type:

string (R)=32×unit cell (R), however, according to a mask ROM of a NAND-NOR type of the present invention, string (R)=17×unit cell (R).

Accordingly, compared to the mask ROM of a duplicate NAND type, in a mask ROM of a NAND-NOR type, according to the present invention, cell integration can be enhanced.

FIG. 15 are sectional views showing the cell structure and vertical structure by each portion of a mask ROM of a NAND-NOR type, according to the present invention. Here, section "A" shows a vertical channel wordline (VWL) of a first gate electrode 106 and a channel width of a first cell transistor. Section "B" shows a channel length of the first cell transistor where data are programmed in a depletion type and an enhancement type. Section "C" shows a horizontal channel wordline (HWL) of a second gate electrode 114 and a length of a second cell transistor and section "D" shows a width of the second cell transistor where data are programmed by eliminating a device isolation film, and then ion-implanting phosphorus ($Ph^+$) impurity for offsetting a high boron ($B^+$) concentration therebelow. Reference numeral 100 denotes a semiconductor substrate, 102 denotes a device isolation film, 104 denotes a first gate dielectric film, 106 denotes a first gate electrode, 108 denotes a first insulating layer, 110 denotes a spacer, 112 denotes a second gate dielectric film, and 114 denotes a second gate electrode. "DEP" denotes an ion-implanted region for initializing a cell transistor to a depletion type, "$B^+$ PGM" denotes a programmed region by ion-implanting boron in the first cell transistor, and "$Ph^+$ PGM" a programmed region by ion-implanting phosphorus.

FIGS. 16A through 21D are sectional views for illustrating a method for manufacturing a mask ROM of a NAND-NOR type according to an embodiment of the present invention. Here, each view of "A", "B", "C", and "D" is dependent upon each section "A", "B", "C", and "D" of FIG. 15.

FIGS. 16A through 16D show the steps of forming a first gate dielectric film 104. A device isolation film 102 is formed on a semiconductor substrate 100 by performing a usual device isolation process, to thereby divide an active region and a device isolation region. Here, a channel stop layer 101 can be formed under device isolation film 102 by ion-implanting an impurity of a conductivity type the same as that of substrate 100 for strengthening the device isolation characteristic before starting the process of oxidation for forming device isolation film 102. Subsequently, on the whole surface of the resultant structure where device isolation film 102 is formed, an impurity region 103 for initializing a cell transistor to a depletion type is formed by ion-implanting an n-type impurity, for example, arsenic ($As^+$), and then a first gate dielectric film 104 is formed on the resultant structure by thermal oxidation.

FIGS. 17A through 17D show the steps of forming a first gate electrode 106. After a gate material layer is formed by depositing polysilicon or metal polycide on the resultant structure where first gate dielectric film 104 is formed, and then silicon oxide or/and silicon nitride is/are deposited thereon, to thereby form a first insulating layer 108 used as an etching mask when forming a gate electrode. Subsequently, first insulating layer 108 is patterned to a gate pattern by photolithography, and then a gate material layer in the lower portion thereof is etched with patterned first insulating layer 108 as a etching mask 108, to thereby form first gate electrode 106.

FIGS. 18A through 18D show the steps of forming source/drain regions ($N^+$, $P^+$). After forming lightly doped drain (LDD) by ion-implantation using the first gate electrode as an ion-implanting mask, an insulating material such as a silicon oxide is deposited on the whole surface of the resultant structure, to thereby form a second insulating layer. Subsequently, a spacer 110 is formed on the sidewalls of first gate electrode 106 by etching-back the second insulating layer, and then a source/drain ion-implantation is performed using first gate electrode 106 and spacer 110 as an ion-implanting mask, to thereby form an $N^+$ source/drain region on an NMOS transistor, and a P+ source/drain region on a PMOS transistor, respectively. When etching for forming spacer 110, first insulating layer 108 should be left on the upper portion of first gate electrode 106.

FIGS. 19A through 19D show the steps of programming a first cell transistor. A predetermined cell portion of the first cell transistor initialized (see "DEP") to a depletion type as seen in FIGS. 16A through 16D is opened by the lithography process, but the other region is covered with a first photoresist pattern (PR). Then, a p-type impurity, i.e., boron is ion-implanted at a high energy level using the first photoresist pattern (PR) as an ion-implanting mask, to thereby transform the first cell transistor to an enhancement type (see "B+ PGM").

FIGS. 20A through 20D show the steps of programming a second cell transistor. After the first photoresist pattern is eliminated, a region where a channel of a second cell transistor is to be formed is opened by lithography. The other region is covered with a second photoresist pattern (PR). Subsequently, a device isolation film of the channel region of the second cell transistor is eliminated using the second photoresist pattern (PR) as an etching mask, then an n-type impurity of a high concentration, for example, phosphorus or arsenic is ion-implanted (see "Ph+ PGM") to optimize Vth in order to turn-on the second cell transistor when Vcc is supplied to a horizontal channel wordline (HWL) to be selected. At the same time, an "ON"-cell of a horizontal channel wordline (HWL) is programmed.

FIGS. 21A through 21D show the steps of forming a second gate electrode 114. The second photoresist pattern is eliminated, and then a second gate insulating film 112 is formed on the resultant structure by performing thermal oxidation. Further a conductive material, for example, polysilicon or metal polycide is deposited thereon. Subsequently, the conductive material layer is patterned by photolithography, to thereby form a second gate electrode 114.

FIGS. 22A through 23D are sectional views for illustrating a method for manufacturing a mask ROM of a NAND-NOR type according to another embodiment of the present invention.

In FIGS. 22A through 22D, manufacturing processes of the same as those illustrated in FIGS. 16A through 19D are performed, a region for a channel of a second cell transistor is opened by lithography, the other region is covered with a second photoresist pattern (PR). Subsequently, an n-type impurity of a high concentration, for example, phosphorus or arsenic is ion-implanted (see "Ph+ PGM") into the channel region of the second cell transistor using the second photoresist pattern (PR) as an ion-implanting mask. As a result, Vth of the second cell transistor is optimized and at the same time data are programmed.

In FIGS. 23A through 23D, the second photoresist pattern is eliminated, then thermal oxidation is performed on the resultant structure, thereby forming a second gate insulating film 112. Subsequently, a second gate electrode 114 of polysilicon or metal polycide is formed on second gate insulating film 112.

Accordingly, as described above, the other cell transistor using a second gate electrode having a channel in a horizontal direction is further formed on a usual single NAND type cell such that a higher integration than that of a double NAND type cell is realized while maintaining the same cell current as that of a single type cell at the same design rule. Further, it is possible to ensure an excellent uniformity of a cell and to easily ensure a programming margin Besides, even though an interlayer dielectric film for insulating first and second gate electrodes becomes thick, a punch margin to some extent can be ensured lowering the wordline loading capacitance so that high speed operation can be easily performed and an excellent yield can be ensured.

Compared with a manufacturing process of a duplicate NAND type cell, it is possible to ensure a margin of overlap with the first gate electrode when the second cell transistor having the second gate electrode is programmed. Further, it is possible to ensure a sufficient process margin, since boron and phosphorus (or arsenic) having a great difference of a projection range are ion-implanted when first and second cell transistors are programmed, and even though program layers are overlapped in programming, the characteristics of the first and second cell transistors are not affected due to a device isolation film and the first gate electrode.

It should be understood that the invention is not limited to the illustrated embodiment and that many changes and modifications can be made within the scope of the invention.

What is claimed is:

1. A method for manufacturing a semiconductor memory device comprising the steps of:

determining a device isolation region and an active region by forming a device isolation film on a semiconductor substrate;

implanting ions of a first conductivity type on a whole surface of said semiconductor substrate where said device isolation film is formed, in order to initialize a cell transistor to be a depletion type;

sequentially forming a first gate dielectric film and a first gate electrode having an upper portion capped with a first insulating layer on the whole surface of said semiconductor substrate where the ions of the first conductive type are implanted;

forming a source/drain region which is self-aligned on said first gate electrode on said active region of said substrate;

implanting ions of a second conductivity type for programming a first cell transistor which uses said first gate electrode;

programming said device isolation region between a region where a second gate electrode is to be formed and said first gate electrode; and sequentially forming a second gate dielectric film and said second gate electrode which uses said programmed device isolation region as a channel on a resultant structure, where said device isolation region is formed.

2. A method for manufacturing a semiconductor memory device according to claim 1, wherein said second gate electrode is formed of polysilicon or metal polycide which is doped with an impurity.

3. A method for manufacturing a semiconductor memory device according to claim 1, wherein said first gate electrode is formed of metal polycide and said second gate electrode is formed of polysilicon doped with an impurity.

4. A method for manufacturing a semiconductor memory device according to claim 2, wherein a rare-earth metal selected from a group consisting of tungsten (W), titanium (Ti), tantalum (Ta), and molybdenum (Mo) is used for a metal of said metal polycide.

5. A method for manufacturing a semiconductor memory device according to claim 3, wherein a rare-earth metal selected from a group consisting of tungsten (W), titanium (Ti), tantalum (Ta), and molybdenum (Mo) is used for a metal of said metal polycide.

6. A method for manufacturing a semiconductor memory device according to claim 1, wherein said step of programming said device isolation region between the region where said second gate electrode is to be formed and said first gate electrode comprises steps of:

eliminating the device isolation film from the region between said first gate electrode and a place where the second gate electrode is to be formed by lithograph; and implanting ion of the first conductivity type into the resultant structure from the step of eliminating said device isolation.

7. A method for manufacturing a semiconductor memory device according to claim 6, wherein said device isolation film is eliminated by dry-etching.

8. A method for manufacturing a semiconductor memory device according to claim 1, wherein said step of programming the device isolation region between the region where the second gate electrode is to be formed and the first gate electrode comprises a step of implanting ions of the first conductivity type into said device isolation region between the first gate electrode and the region where a second gate electrode is to be formed.

9. A method for manufacturing a semiconductor memory device according to claim 1, wherein said step of forming said source/drain region comprises steps of:

performing a lightly doped drain (LDD) ion-implantation on a whole surface of the resultant structure where said first gate electrode is formed;

forming a spacer consisting of a second insulating layer on the sidewalls of said first gate electrode; and performing a source/drain ion-implantation using said spacer as an ion-implantation mask.

10. A method for manufacturing a semiconductor memory device according to claim 9, wherein in said step of forming the spacer is performed such that said first insulating layer and said second insulating layer are left on an upper portion of said first gate electrode.

11. A method for manufacturing a semiconductor memory device according to claim 9, wherein in said step of forming the spacer is performed such that said first insulating layer or said second insulating layer is left on an upper portion of said first gate electrode.

* * * * *